US008006172B2

United States Patent
Boyer et al.

(10) Patent No.: US 8,006,172 B2
(45) Date of Patent: Aug. 23, 2011

(54) AUXILIARY PATH ITERATIVE DECODING

(75) Inventors: Keith G. Boyer, Broomfield, CO (US);
Jin Lu, Lafayette, CO (US); Mark Hennecken, Denver, CO (US)

(73) Assignee: Oracle America, Inc., Redwood City, CA (US)

( * ) Notice: Subject to any disclaimer, the term of this patent is extended or adjusted under 35 U.S.C. 154(b) by 1068 days.

(21) Appl. No.: 11/775,748

(22) Filed: Jul. 10, 2007

(65) Prior Publication Data
US 2009/0019335 A1      Jan. 15, 2009

(51) Int. Cl.
*H03M 13/03*    (2006.01)
*G06F 11/00*    (2006.01)

(52) U.S. Cl. .......................... 714/786; 714/800

(58) Field of Classification Search .............. 714/746, 714/752, 755, 786, 792, 794–795
See application file for complete search history.

(56) References Cited

U.S. PATENT DOCUMENTS

| | | | |
|---|---|---|---|
| 6,510,536 B1 * | 1/2003 | Crozier et al. | 714/755 |
| 6,848,069 B1 * | 1/2005 | Levy et al. | 714/755 |
| 7,356,753 B2 * | 4/2008 | Chen | 714/755 |
| 7,500,167 B2 * | 3/2009 | Widdup | 714/752 |
| 7,516,389 B2 * | 4/2009 | Song | 714/755 |
| 7,805,664 B1 * | 9/2010 | Yang et al. | 714/794 |

* cited by examiner

*Primary Examiner* — Shelly A Chase
(74) *Attorney, Agent, or Firm* — Marsh Fischmann & Breyfogle LLP; Jonathon A. Szumny; Kent A. Lembke

(57) ABSTRACT

A parallel iterative decoding system interposed between a network interface and a block memory matrix receives encoded data and both stores the data in a First-In-First-Out ("FIFO") memory block and processes it through a timing recovery engine. The timing recovery engine delivers to an iterative decoder synchronized data samples and detects cycle slip. The iterative decoder thereafter performs a predetermined number of iterations to decode the data. Responsive to encoded data failing to converge after the predetermined number of iterations, the encoded data is communicated from the FIFO memory to an auxiliary decoder module. The auxiliary iterative error correction code decoder performs a second predetermined number of iterations to decode the data wherein the number of iterations performed by the auxiliary iterative error correction code decoder is greater than the primary iterative error correction code decoder. Converged data from the auxiliary decoder replaces otherwise null data stored in the block matrix memory.

20 Claims, 8 Drawing Sheets

AUXILIARY PATH ITERATIVE DECODING

BACKGROUND OF THE INVENTION

1. Field of the Invention

Embodiments of the present invention relate, in general, to iterative decoding and particularly to enabling an additional iterative decoding path so as to achieve convergence.

2. Relevant Background

Data communication systems have been under continual development for many years. One such type of communication system and area of development employs LDPC (Low Density Parity Check) codes. A primary directive in this area has been to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems and data storage systems.

According to this approach, a relatively sparse code matrix is defined, such that the product of this matrix with each valid codeword (information and parity bits) equals the zero vector. Decoding of an LDPC coded message to which channel noise has been added in transmission amounts to finding the sparsest vector that, when used to multiply the sparse code matrix, matches the received sequence. This sparsest vector is thus equal to the channel noise (because the matrix multiplied by the true codeword is zero), and can be subtracted from the received sequence to recover the true codeword.

It has become well known in the art that iterative decoding of LDPC codes provides excellent decoding performance, from the standpoint of latency and accuracy, with relatively low hardware or software complexity. Iterative approaches are also quite compatible with turbo codes, LDPC codes, and many other FECC codes known in the art.

Typically, iterative decoding involves the communicating, or "passing", of reliability, or "soft output", values of the codeword bits over several iterations of a relatively simple decoding process. Soft output information includes, for each bit, a suspected value of the bit ("0" or "1"), and an indication of the probability that the suspected value is actually correct. For the initial decoding of an incoming input, these a-priori probabilities are simply initialized to a neutral value (i.e., no knowledge of their likelihood) or the values from the channel detector (e.g., SOVA).

The decoding continues for a number of iterations, until some termination or convergence criterion is reached. Termination of the iterations may be based on a data-dependent convergence criterion. For example, the iterations may continue until there are no bit changes from one iteration to the next, at which point convergence may be assumed because the bits will then tend to reinforce their probabilities. Typically, conventional communications equipment performs a pre-selected number of iterations without regard to the results, with the number of iterations selected by way of experimentation or characterization.

One process well known in the art is the iterative operation of a "belief propagation" approach to LDPC decoding. In its conventional implementation, the belief propagation algorithm uses two value arrays, a first array storing the log-likelihood-ratios (LLRs), for each of j input nodes corresponding to the bits in the codeword; this array is also referred to in the art as the array of "variable" nodes. A second array stores the results of m parity check node updates; this array is also referred to as the array of "checksum" nodes. A graphical representation of these two arrays can be seen in FIG. 1 in what is commonly referred to in the prior art as a Tanner graph. In FIG. 1 the checksum nodes, or c-nodes 110 (collectively), are represented by 4 blocks $f_{0-3}$ $110_{0-3}$. Variable nodes, or v-nodes 120 (collectively) are represented by 8 circles $c_{0-7}$ $120_{0-7}$. The values m and j typically differ from one another; with typically many more codeword bits j than there are checksum equations m.

As shown by the lines in FIG. 1, information is communicated back and forth between the variable nodes 120 and the checksum nodes 110 in each iteration of this LDPC belief propagation approach (also referred to as "message passing"). In its general operation, in a first decoding step, each of the variable nodes 120 communicate the current LLR value for its codeword bit to each of the checksum nodes 110 that it participates in. Each of the checksum nodes 120 then derives a check node update for each LLR value that it receives, using the LLRs for each of the other variable nodes 120 participating in its equation. As mentioned above, the parity check equation for LDPC codes requires that the product of the parity matrix with a valid codeword is zero. Accordingly, for each variable node 120, checksum node 110 determines the likelihood of the value of that input that will produce a zero-valued product; for example, if the five other inputs to a checksum node that receives six inputs are strongly likely to be a "1", it is highly likely that the variable node under analysis is also a "1" (to produce a zero value for that matrix row). The result of this operation is then communicated from checksum nodes 110 to its participating variable node 120. In the second decoding step, the variable node 120 updates its LLR probability value by combining, for its codeword bit, the results for that variable node 110 from each of the checksums in which that input node participated. This two-step iterative approach is repeated until a convergence criterion is reached, or until a terminal number of iterations have been executed.

As known in the art, other iterative coding and decoding approaches are known. But in general, each of these iterative decoding approaches generates an output that indicates the likely data value of each codeword bit, and also indicates a measure of confidence in that value for that bit (i.e., probability).

FIG. 2 is a prior art histogram 200 showing the number of iterations required to achieve convergence of 50,000 blocks of encoded data. In FIG. 2 the horizontal axis 210 represents the number of iterations to achieve convergence and the vertical axis 220 represents the number of blocks that achieved convergence at any particular number of iterations. As shown, the majority of the blocks converged during 4-6 iterations 230. The histogram also demonstrates that only a small portion of the total number of blocks require more than 15 iterations, 250 to converge. While as the performance of convergence continues to increase as the number of iterations increases, this broadening of the number of maximum iterations comes at a cost of increased decoding complexity.

FIG. 3 is a logarithmic line graph 300 showing the relationship of block error rate and iterations to convergence, as is known in the prior art. As one would expect, the block error rate, represented on the vertical axis 320 of the graph, decreases as the number of iterations, represented on the horizontal axis 310, increases. One should note the logarithmic nature of the vertical axis, block error rate. Correlating this data with that, FIG. 2 shows that the decrease in error rate changes at a point 330 approximately between 6-7 iterations. This point is representative of the diminishing returns of excessive iterations. More iterations deliver a lower error rate but at a higher cost.

As mentioned above, iterative decoders can provide excellent performance at reasonable complexity from a circuit or software standpoint. However, the decoding delay, or latency, depends strongly on the number of decoding iterations that are performed. It is known, particularly for parallel concatenated convolutional codes (PCCCs), that this latency may be reduced by parallelizing the decoding functions. For an example of a two-stage decoder requiring five iterations, it is possible to implement ten actual binary convolutional code decoders, each of which operates on one-tenth of the Viterbi trellis for the decoding. It has been observed that such parallelization can provide essentially no performance loss, while greatly reducing the decoding latency in the system. However, the hardware required for such parallelization is substantial (e.g., 10× for this five iteration example).

Accordingly, the architects of decoding systems are faced with optimizing a tradeoff among the factors of decoding performance (bit error rate), decoding latency or delay, and decoder complexity (cost). The number of iterations is typically determined by the desired decoder performance, following which one may trade off decoding delay against circuit complexity, for example by selecting a parallelization factor.

SUMMARY OF THE INVENTION

Briefly stated, embodiments of the present invention involve iterative error correction code processing. An iterative error correction code system and method utilizing an auxiliary decoding path are disclosed. A parallel iterative decoding system interposed between a read channel input and a block memory matrix receives sampled data and both stores the data in a First-In-First-Out ("FIFO") memory block and processes it through a timing recovery engine. The timing recovery engine delivers to an iterative decoder synchronized data samples as well as examines the data for the presence of cycle slip. The iterative decoder thereafter performs a predetermined number of iterations to decode the data.

Responsive to encoded data failing to converge after the predetermined number of iterations has been accomplished, the encoded data is communicated from the FIFO memory to an auxiliary decoder module. Again the data is processed by a timing recovery engine. During this auxiliary timing recovery process, a previous detection of cycle slip is corrected by, either inserting or deleting bits within the block of data.

Data is thereafter presented to an auxiliary iterative error correction code decoder that performs a second predetermined number of iterations to decode the data. The number of iterations performed by the auxiliary iterative error correction code decoder is greater than the primary iterative error correction code decoder and thus provides a higher likelihood of convergence. Data that converges is associated with a block of null data that was stored in the block matrix memory as a placeholder for data that was not decoded by the primary error correction code decoder.

The features and advantages described in this disclosure and in the following detailed description are not all-inclusive, and particularly, many additional features and advantages will be apparent to one of ordinary skill in the relevant art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

Figure 1:
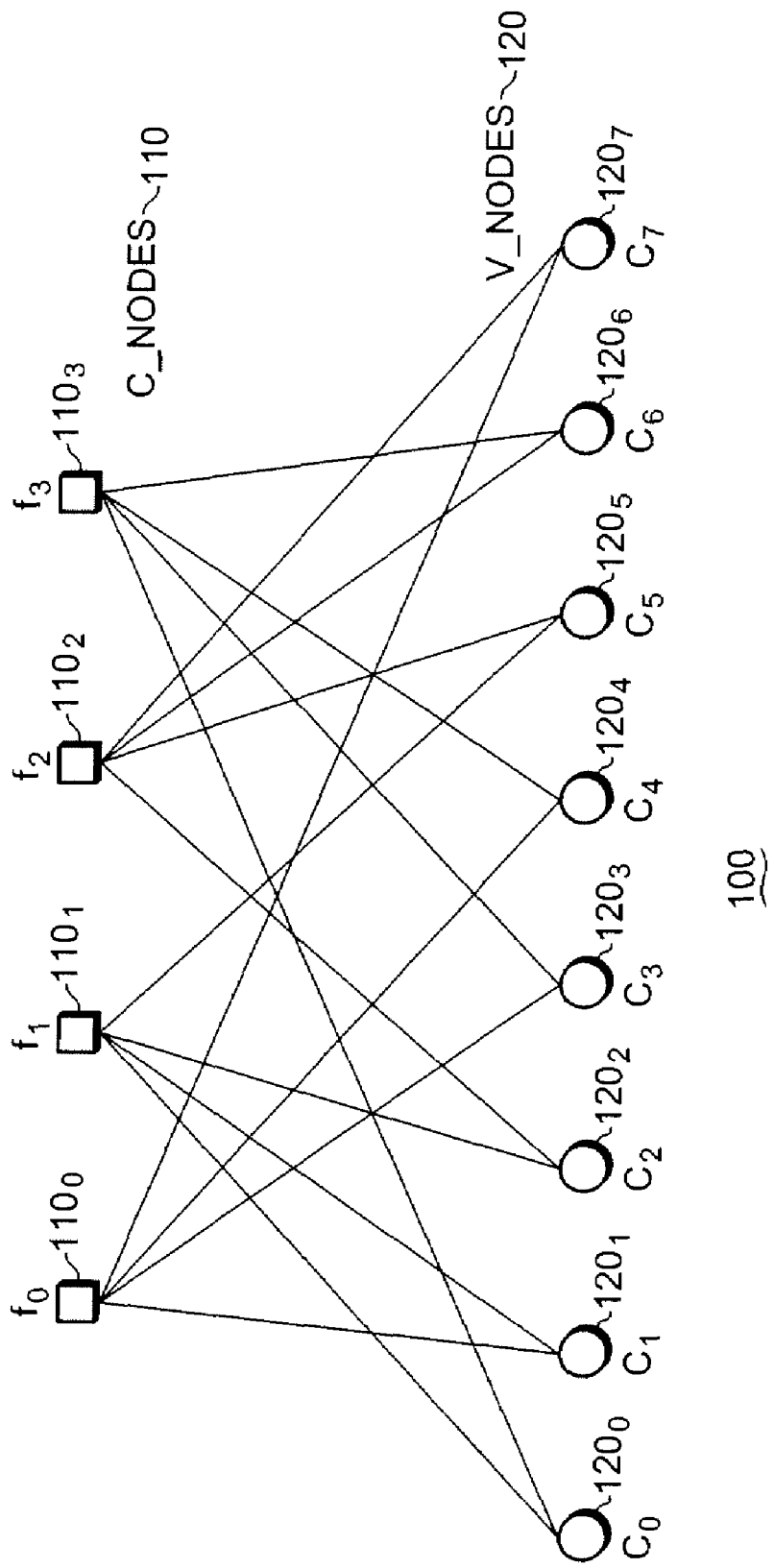
FIG. 1 a graphical representation of LDPC codes, as is known in the prior art as a Tanner graph.

The Figures depict embodiments of the present invention for purposes of illustration only. One skilled in the art will readily recognize from the following discussion that alternative embodiments of the systems and methods illustrated herein may be employed without departing from the principles of the invention described herein.

DETAILED DESCRIPTION OF THE PREFERRED EMBODIMENTS

Specific embodiments of the present invention are hereafter described in detail with reference to the accompanying Figures. Like elements in the various Figures are identified by like reference numerals for consistency. Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention.

Embodiments for a system and a method to iteratively decode communication data using an iterative error correction code decoder are discussed herein. Encoded data is delivered to a main iterative decoder and iteratively decoded for a predetermined number of iterations. If the data converges after the predetermined number of iterations, the block is passed to a buffer and thereafter passed to subsequent error correction code techniques known in the art. Responsive to the data not converging, a null block is used to represent the non-decoded data in a buffer while the still encoded data is placed in an auxiliary decoder which also performs an iterative decoding process but from a larger number of iterations. Upon data convergence, the newly decoded block of data replaces the null block in memory and the entire data string is then conveyed to further error correction techniques.

Figure 4:
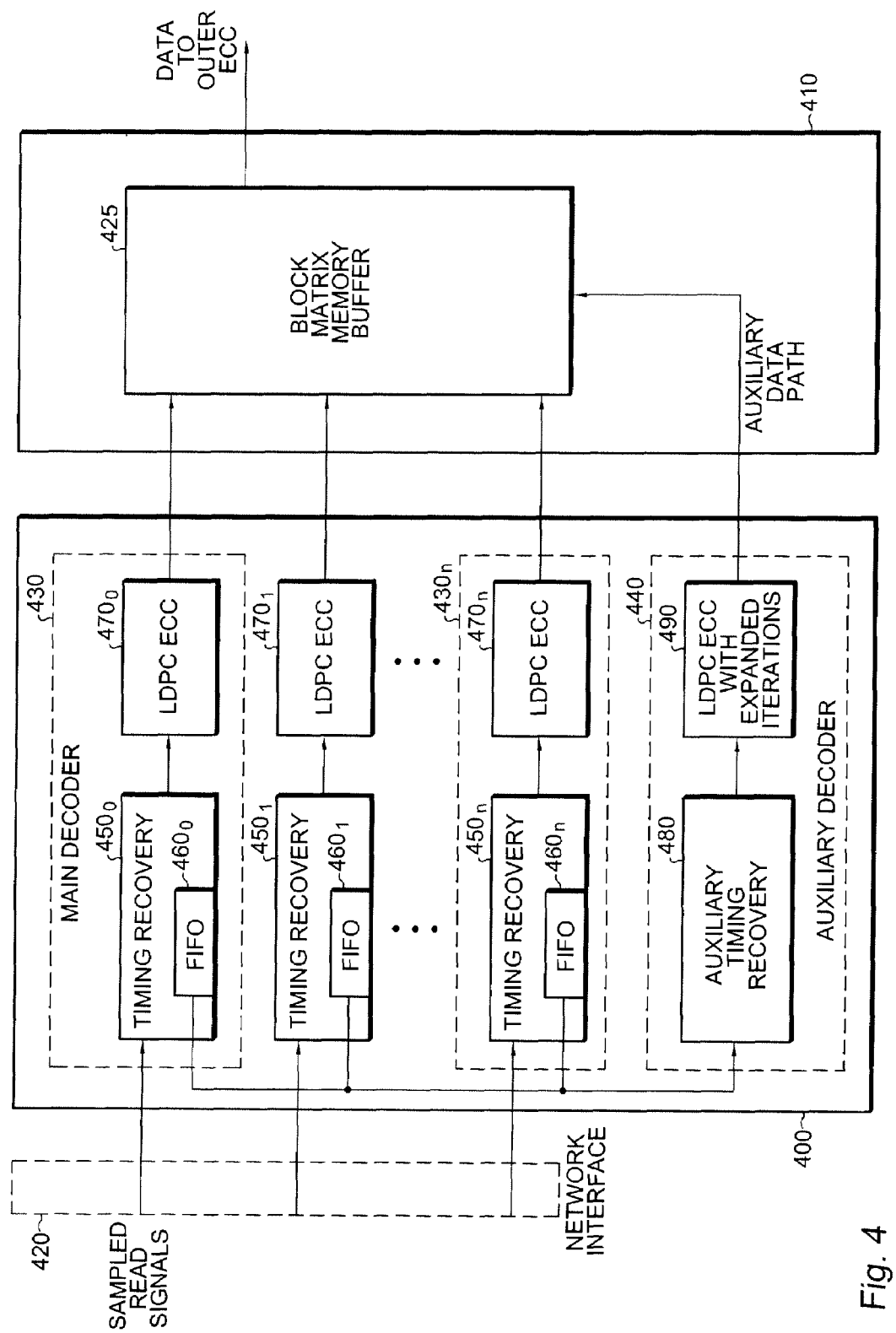
FIG. 4 shows a high level block diagram of an iterative decoding system according to one embodiment of the present invention.

FIG. 4 depicts a block diagram for an iterative LDPC code decoding system comprising an auxiliary decoding path, according to one embodiment of the present invention. The iterative decoding system shown comprises a decoding module 400 communicatively interposed between a memory module 410 and a network interface 420. Encoded communications signals, often containing noise corrupted data, arrive at the decoding module 400 from the network interface 420, are iteratively decoded, and then transported to the memory module 410 for buffering in a block matrix memory buffer 425 prior to being passed to other error correction code processes. While the example of a LDPC iterative decoder is used for illustrative purposes, one skilled in the art will appreciate that the present invention is equally applicable to other types of iterative decoding. Indeed other forms of iterative decoders are contemplated such as turbo code decoders, turbo product code decoders, soft decoding Reed Solomon code decoders and the like.

The decoding module 400 comprises a plurality of main decoder modules $430_{0-n}$ configured in parallel and at least one auxiliary decoder module 440. Each main decoder module 430 is communicatively coupled to the network interface 420 and the block matrix memory buffer 425. Additionally, each main decoder module 430 is linked to an auxiliary decoder module 440. Output of the auxiliary decoder module is also conveyed to the block matrix memory buffer 425.

Each main decoder module 430 comprises a timing recovery engine $450_{0-n}$ which includes a block FIFO memory $460_{0-n}$ and a LDPC error correction code decoder $470_{0-n}$. Similarly the auxiliary decoder module 440 comprises an auxiliary timing recovery engine 480 and a LDPC error correction code decoder 490.

Upon the arrival from the network interface 420, individual blocks of encoded data contained in the data pipeline are conveyed to separate main decoder modules 430 for decoding. The timing recovery engine 450 synchronizes code symbols so as to maintain what is known in the art as the continuity of the Virerbi sequence and detects the incidence of cycle slip. Should such a cycle slip be detected, the timing recovery engine 450 flags the block for repair. The phenomenon of cycle slip, as is well known in the art, occurs during instances of low SNR. Communication codes typically operate at very low SNR. Symbol synchronization at very low SNR becomes critical in order to utilize the code's full code gain potential. In the magnetic recording channel, conventional timing recovery devices, e.g., synchronizers, tend to experience cycle-slip at low SNR that results in a burst of symbol detection errors and thus a burst of decoding errors. These errors cannot be overcome by LDPC iterative decoding.

Simultaneously with the introduction of the encoded data to the timing recovery engine 450, a copy of the data is stored in a temporary FIFO memory block 460. Data which is synchronized by the timing recovery engine 450 is communicated to a LDPC error correction code decoder 470. The LDPC error correction code decoder 470 thereafter iteratively decodes the encoded data for a predetermined number of iterations. As previously discussed, convergence is statistically likely to occur within the first several iterations. Therefore, the number of iterations performed by the LDPC error correction code decoder 470 of each main decoder module 430 is set based on a trade off between the processing time needed to perform the iterations as opposed to slowing down the pipeline of data. For example, to maintain a normal pipeline flow and yet increase the number of iterations to be performed based on a desired block error rate, additional parallel main decoder modules, (i.e. additional hardware) may be necessary. Thus, traditionally, a desire to lower the error block rate comes at the cost of additional decoder modules (LDPC decoders).

In another embodiment of the present invention, the LDPC error correction code decoder 470 monitors its progress during the iterations. Codes that demonstrate consistent decreases in error rate during each subsequent iteration is more likely to converge than those blocks of code in which error rate fluctuates or remains constant during each iteration. Those that show a consistent or steady decrease, while not necessarily converged, are identified as likely to converge should additional iterations be applied. Likewise, those error blocks in which the error rate fluctuates or remains constant over a series of iterations can be identified as unlikely to converge regardless of the number of iterations. This unlikelihood of convergence can be the result of cycle slip, which is discussed in the sections that follow, or other error conditions that cannot be resolved by the decoder. In situations in which cycle slip is not identified but the code is deemed unlikely to converge regardless of the number of iterations, a null block replaces the code and the block is identified as not being suitable for auxiliary iterations. Likewise, those blocks that are flagged as likely to converge with additional iterations or marked as possessing cycle slip are identified as suitable candidates for further processing by the auxiliary decoding module 440.

Figure 2:
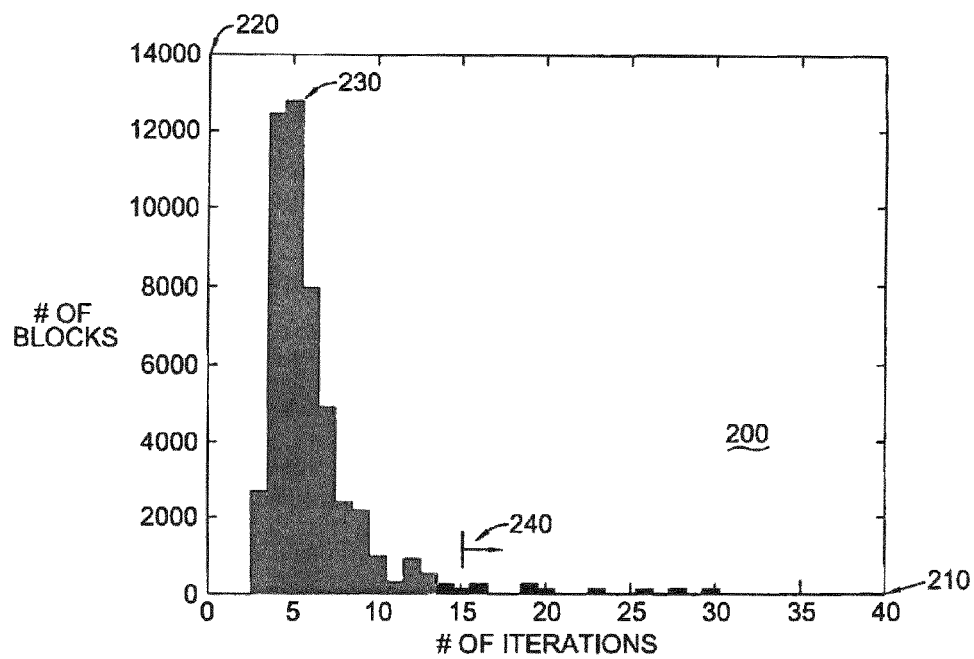
FIG. 2 shows a histogram of the relationship between convergence of blocks of encoded data and the number of iterations required to achieve that convergence, as known in the prior art.
Figure 3:
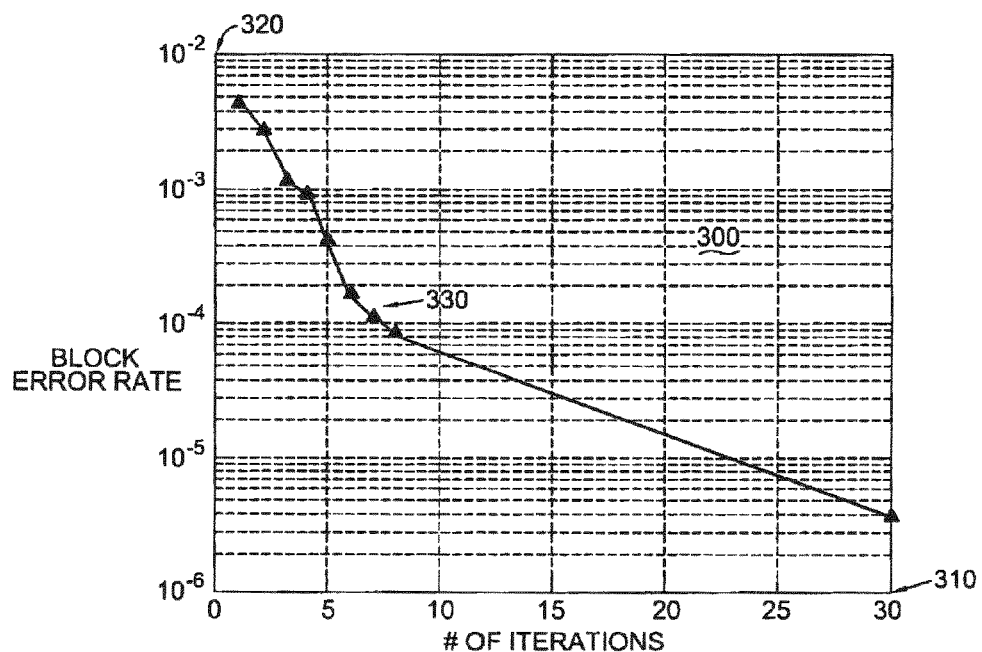
FIG. 3 shows a logarithmic line graph of the relationship between block error rate and the number of iterations performed in a LDPC decoding operation, as is known in the prior art.

In one embodiment of the present invention at least one auxiliary LDPC decoder is utilized to enhance situations in which more decoding iterations may be necessary to achieve convergence without the need for adding a plurality of additional main LDPC decoders to the decoding system. As was shown in FIGS. 2 and 3, the majority of blocks in a sample set of encoded data converge within 4-6 iterations after being submitted to a LDPC iterative decoder. Referring to FIG. 3, a convergence at 4-6 iterations produces on average a block error rate of $10^{-4}$. It is also clearly evident from FIG. 2 that blocks of non-convergent data, encoded data that does not converge within the 4-6 iteration range, will converge should additional iterations take place. While these numbers are small with respect to the total number of blocks converged, extending the number of iterations to 25 would decrease the block error rate to less than $10^{-5}$.

Embodiments of the present invention provide an auxiliary path of LDPC decoding to enable those blocks that fail to converge in a first preset number of iterations to attempt to converge using a larger number of iterations. This enhanced number of iterations is done without delaying the normal pipeline of data nor adding significant additional hardware. As will be appreciated by one skilled in the art, the present invention is equally applicable to embodiments with multiple auxiliary decoders and/or multiple auxiliary data paths. The number of auxiliary data paths, in one embodiment of the present invention, can be based on how frequently data must be passed to the auxiliary decoders to maintain the pipeline.

As shown in FIG. 4, one embodiment of the present invention includes a block matrix memory 425 acting as a buffer for the decoded pipeline of data. The block matrix memory 425 acts to reconstitute the pipeline of data that was decoded in parallel. As compared to the decoding of each individual block during the iterative process, the reconstitution of the pipelined data is on the orders of several magnitudes longer in duration. That excess time enables an auxiliary decoder module 440 to reattempt to decode the encoded data using a significantly larger number of iterations. When situations occur that the main decoder module 430 fails to decode a block of data, a null block is sent to the block matrix memory 425 rather than a decoded section of data. At the same time, the data, which was stored in the main decoder's FIFO memory block 460, is in one embodiment of the present invention, forwarded to an auxiliary decoder module 440. There, the encoded block of data undergoes timing recovery by an auxilary timing recovery engine 480 associated with the auxiliary decoder module 440 just as if it were being processed by a main decoder module 430. Thereafter, the auxiliary LDPC error correction code decoder 490 conducts an expanded number of iterations in an attempt to achieve convergence. In one embodiment of the present invention, the number of iterations chosen for the main decoder module 430 and the auxiliary decoder module 440 can be based on a statistical error analysis, the system requirement of the block error rate and/or the hardware resources (number of gates, memory, etc.) available.

In rare situations, even an expanded number of iterations will not result in data convergence. In such a situation that particular block of the data in the block matrix memory 425 remains null and is corrected by other error correction code techniques as are known in the art. Similarly, if the timing recovery engine 450 is not able to synchronize the code symbols resulting in a cycle slip situation, neither the main LDPC error correction code decoder 470 or the auxiliary LDPC error correction code decoder 490, regardless of the number of iterations, will achieve convergence. As described below, this situation is resolved by the creation of a cycle slip index.

Figure 5:
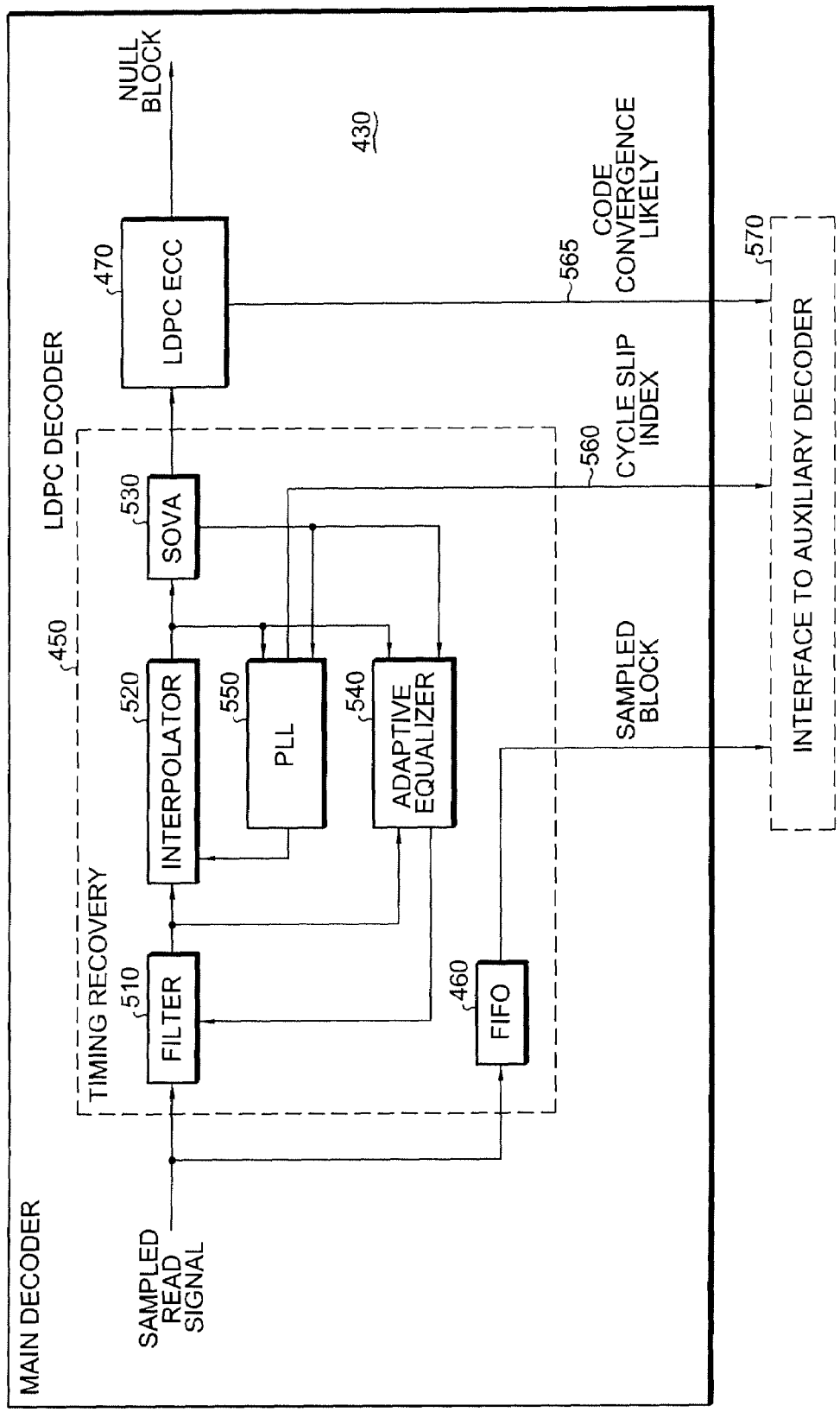
FIG. 5 shows a high level block diagram of a main decoder module according to one embodiment of the present invention.

FIG. 5 depicts a high level block diagram of the main decoder module 430 according to one embodiment of the present invention. Signals arriving from the network interface 420 are delivered to both the timing recovery engine 450 and the FIFO memory 460. As previously mentioned, the timing recovery engine 450 is an iterative device that ensures symbol synchronization. The timing recovery engine comprises a filter 510, a interpolator 520, a Soft Output Viterbi Algorithm ("SOVA") 530, an adaptive equalizer 540, and a phase lock loop ("PLL") 550.

The timing recovery engine 450 typically delivers synchronized encoded data (samples) to the main LDPC error correction code decoder 470 for iterative decoding. The timing recovery engine 450 creates SOVA samples which are provided to and buffered by the LDPC error correction code decoder 470 for use during the iteration process. However, one function of the timing recovery engine is also to detect and mark data possessing what is known in the art as cycle slip. During the timing recovery process, the PLL is attempting to extract the correct time from the data sequence. Normally this process is successful. However, when a substantial amount of noise is present at a particular time, the recovery loop will see that noise as more or less time than really exists. The result is that the timing recovery engine 450 can mistakenly insert or drop a bit into/from the sequence. Blocks of data are fixed in length and sequence. If the data is off by one or two bits a decoder is incapable of resolving that data because every bit in the block is off by those inserted or deleted bits.

Upon the detection of cycle slip by the time recovery engine 450 associated with one of the main decoder modules 430 and in accordance with another embodiment of the present invention, a cycle slip index 560 is created. This index 560 is conveyed to an auxiliary decoder module interface 570. The auxiliary decoder interface 570 also serves to convey data and information from the FIFO memory 460 and LDPC error correction code decoder 470 (convergence likelihood 565) to the auxiliary decoder module 440.

Figure 6:
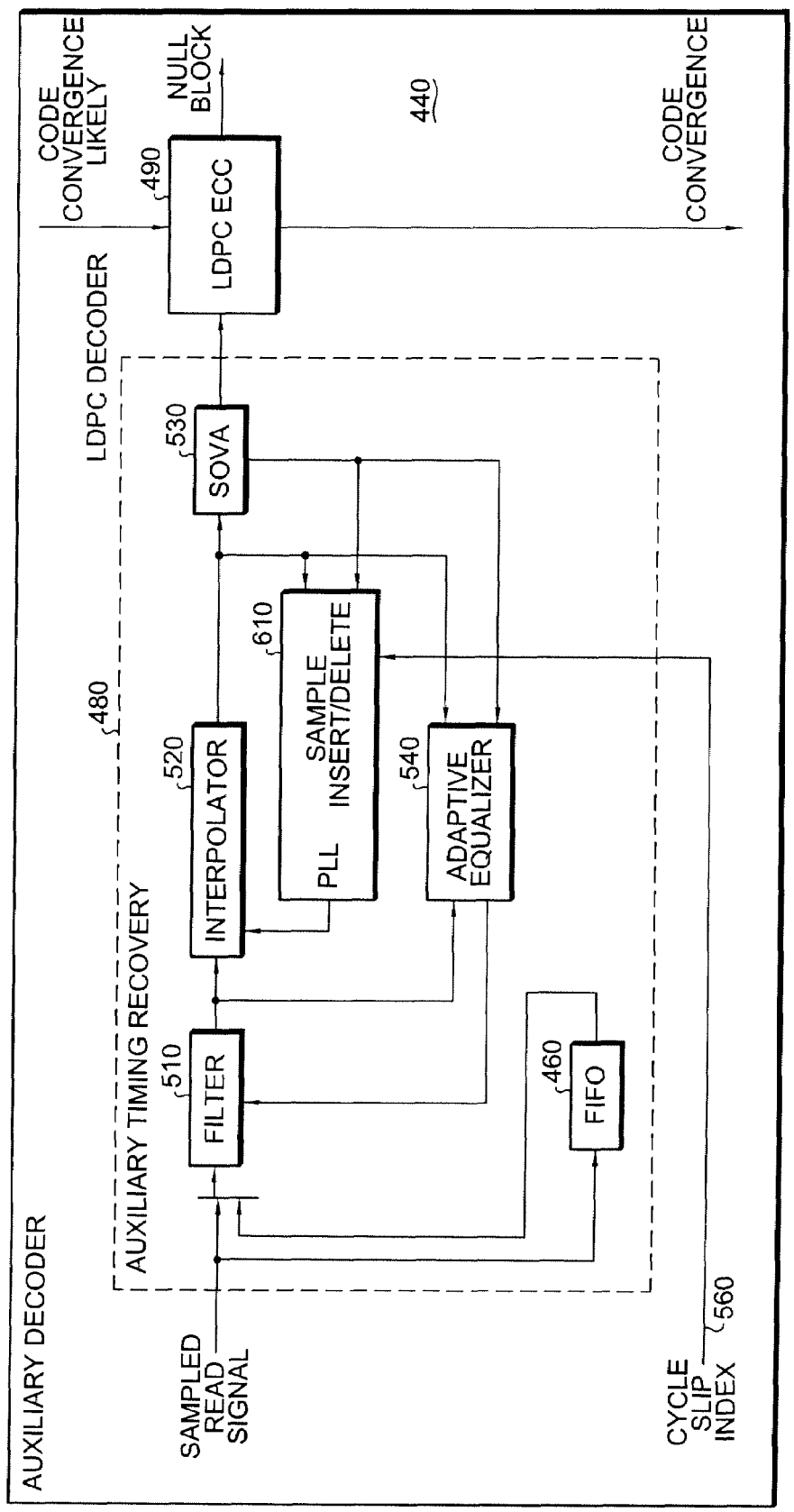
FIG. 6 shows a high level block diagram of an auxiliary decoder module according to one embodiment of the present invention.

Turning in addition to FIG. 6, one embodiment of an auxiliary decoding module 440 according to the present invention is shown. Inputs into the auxiliary decoding module 440 come from the auxiliary decoder interface 570 comprising sampled data stored in the FIFO memory 460, the cycle slip index 560, and a marker that codes convergence is likely to occur 565. Data supplied to the auxiliary decoder module 440 is identical to that data supplied to the main decoder module 430. Data again processes through an auxiliary timing recovery engine 480 in which the correct synchronization is extracted.

The components of the auxiliary timing recovery engine 480 associated with the auxiliary decoder module 440 are identical to that of the timing recovery engine 450 of the main decoder module 430 with one significant exception. The PLL 610 of the auxiliary timing recovery engine 480 possesses the capability to insert or delete a cycle and then continue to recover timing based on the cycle slip index 560. Once cycle slip has been resolved, the data is passed to the LDPC error correction code decoder 490 of the auxiliary decoder module 440 for decoding iterations. The results of the decoder 490, after a predetermined number of iterations, that number of iterations being larger than implemented by the main LDPC error correction code decoder, are thereafter conveyed to the block memory matrix buffer 425 as either converged data or a null block.

In one embodiment of the present invention information with respect to the likelihood of the convergence of the data is communicated from the main LDPC error correction code decoder 470 to the auxiliary LDPC error correction code decoder 490. This information can be used to adjust the number of iterations or, in another embodiment of the present invention, begin the iterations of the auxiliary LDPC decoder 490 at the point at which the main LDPC decoder 470 stopped. This type of state information of the main decoder can lead to quicker convergence from the auxiliary LDPC decoder albeit at the cost of a more complex and a likely more expensive auxiliary decoder module 440. Furthermore, in situations wherein the main decoder 470 passes state information to the auxiliary LDPC decoder 490, the auxiliary timing recovery engine 480 associated with the auxiliary decoder module 440 may be eliminated.

In another embodiment of the present invention, the auxiliary decoder module 440 can be directed to prioritize what blocks of data are being decoded. A priority system which evaluates the likelihood of convergence can determine whether certain blocks of data should precede others in the auxiliary decoding process. For example, if convergence is deemed very likely based on the results of the main decoder module's assessment of the initial iterations, as opposed to somewhat likely, the block of data identified as being very likely to converge can be given a higher priority for utilization of the auxiliary decoder module 440. Similarly, any block of data which has a likelihood of convergence may be deemed as more worthy of the limited resources of the auxiliary decoder module 440 as compared to a block of data that has been identified as possessing cycle slip. A variety of criteria and rules can be developed to manage flow of data channeled to the one or more auxiliary decoder modules 440 so as to maximize performance and/or minimize cost.

Figures 7, 7A, 7B, 7C:
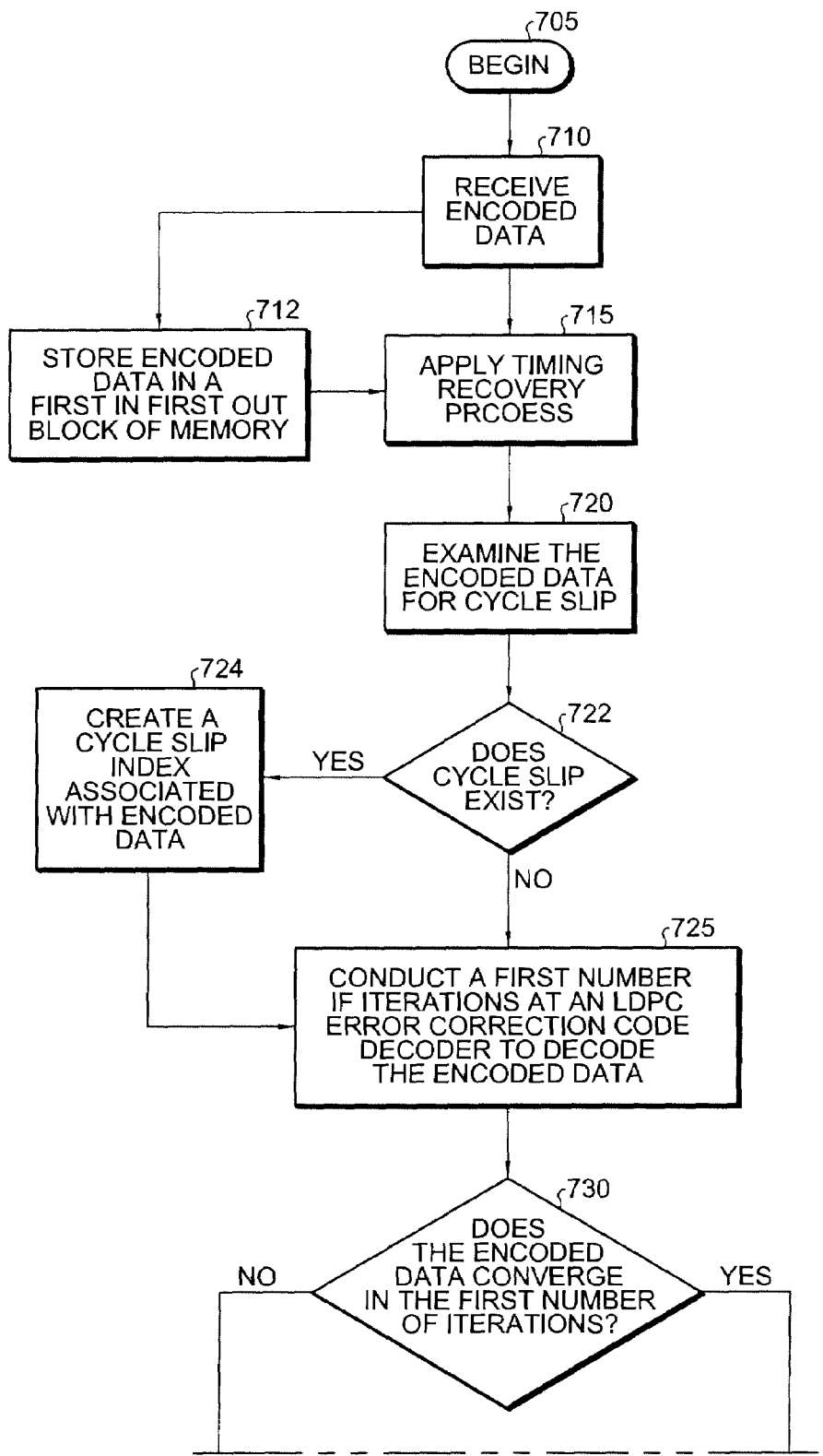
FIG. 7 is a high level flow chart showing one method embodiment for iterative decoding according to the present invention.
Figure 7B:
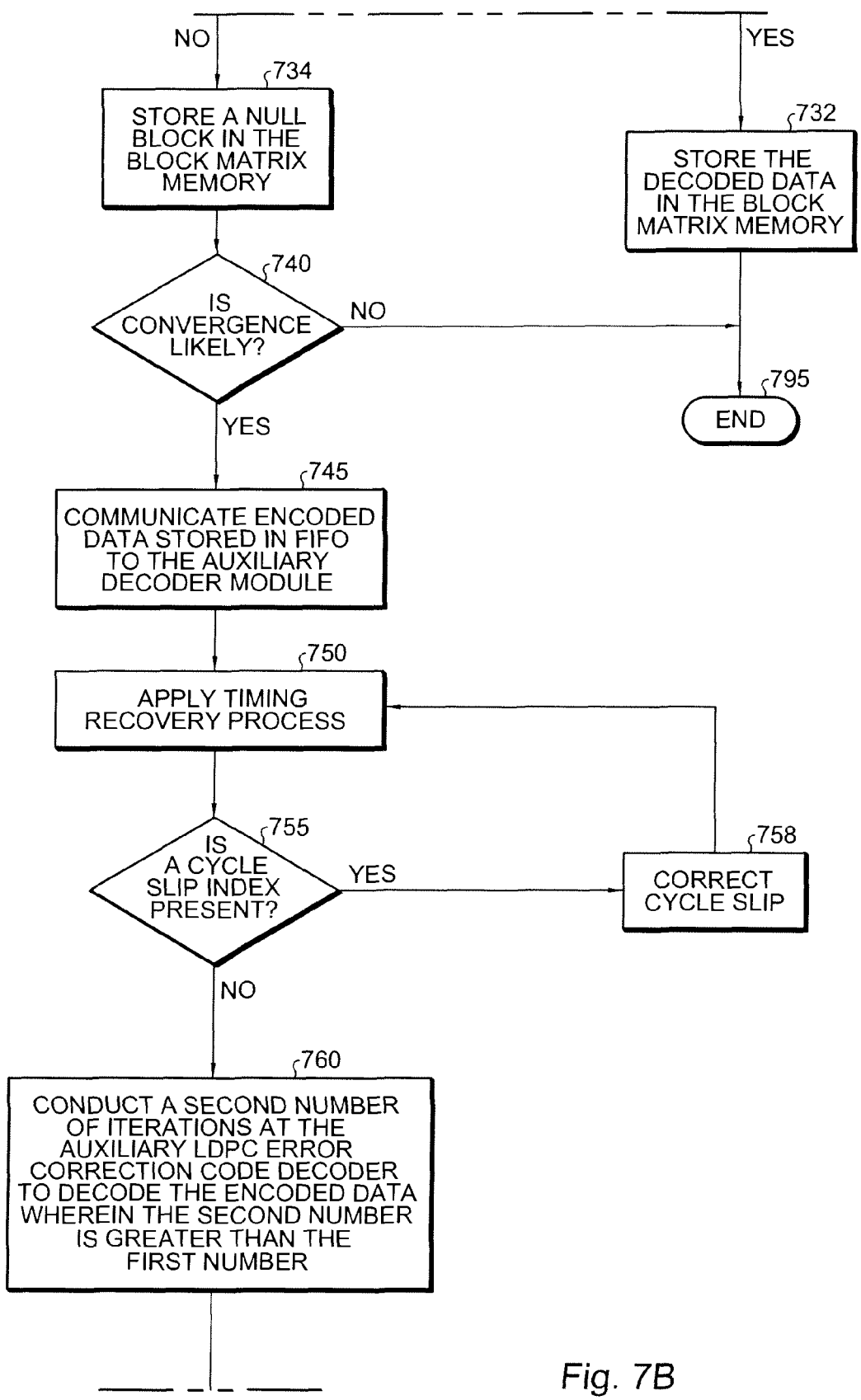
Figure 7C:
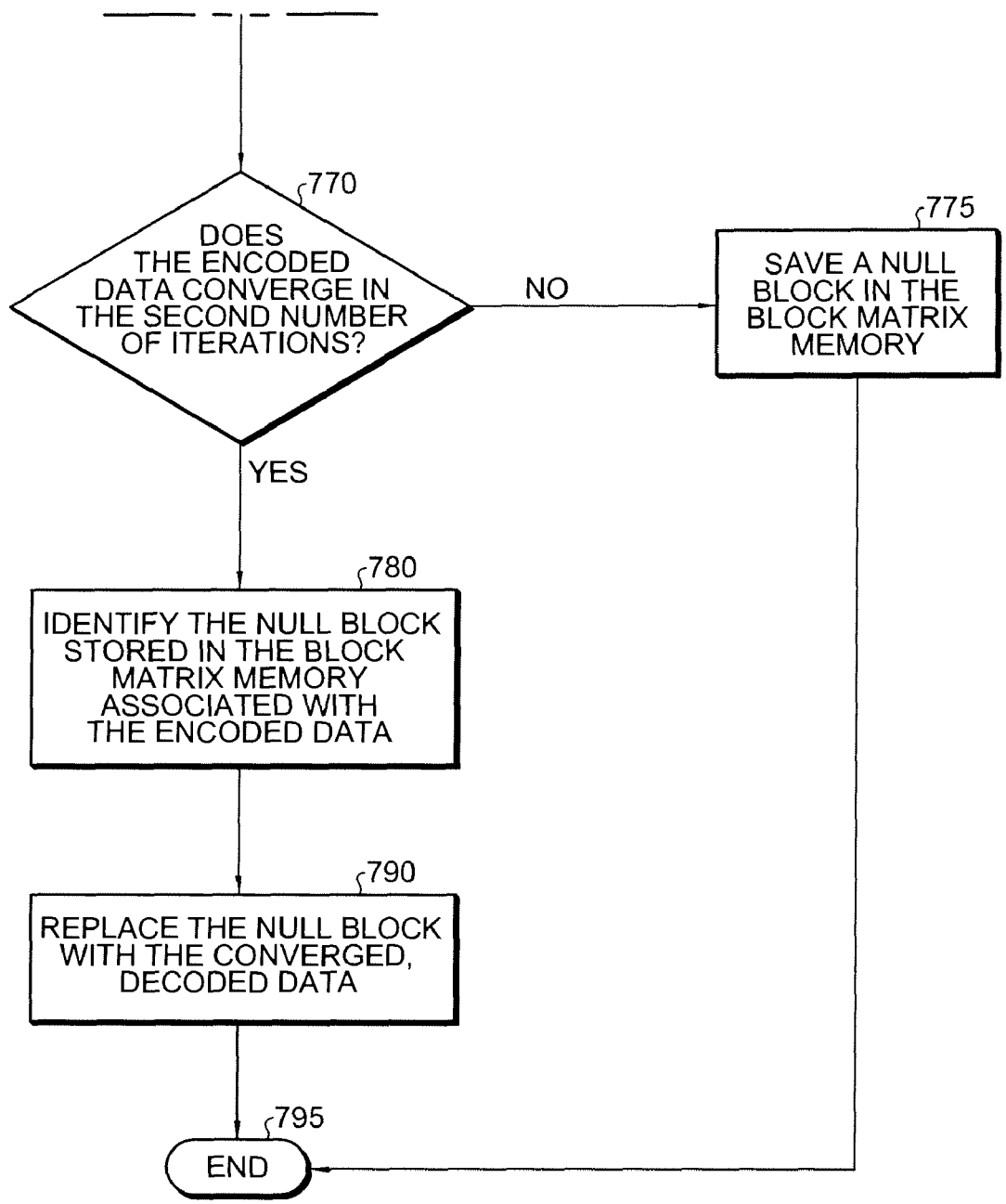

These and other implementation methodologies for iterative decoding can be successfully utilized by the iterative decoding system of the present invention. Although the invention has been described and illustrated with a certain degree of particularity, it is understood that the present disclosure has been made only by way of example, and that numerous changes in the combination and arrangement of components can be resorted to by those skilled in the art without departing from the spirit and scope of the invention.

FIG. 7 is a flowchart illustrating an iterative decoding method. In the following description, it will be understood that each block of the flowchart illustrations, and combinations of blocks in the flowchart illustrations, can be implemented by computer program instructions and/or firmware, and/or hardware. These instructions may be loaded onto a computer or other programmable apparatus to produce a machine, such that the instructions which execute on the computer or other programmable apparatus create means for implementing the functions specified in the flowchart block or blocks. These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block or blocks. The instructions may also be loaded onto other programmable apparatus to cause a series of operational steps to be performed to produce a process such that the instructions provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer instructions.

The method depicted in FIG. 7 begins 705 with the receipt of encoded data 710 at the network interface 420. Once received the encoded data is stored 712 in a FIFO block of memory as well as being passed to the timing recovery module 460 of one of the main decoder modules 430 for the application of a timing recovery process 715. During that process the encoded data is examined 720 for the presence of cycle slip. Responsive to cycle slip existing 722, a cycle slip index associated with the encoded data is created 724. Responsive to cycle slip not existing 722 the encoded data is passed to the main LDPC error correction code decoder 470 for iterative decoding.

The main LDPC error correction code decoder 470 conducts 725 a first, predetermined, number of decoding iterations to decode the encoded data. Upon determining 730 that the encoded data has converged, the now decoded data is stored 732 in the block matrix memory buffer 425. Upon determining 730 that the encoded data has not converged in the first number of iterations, a null block is stored 734 in the block matrix memory 425. When convergence does not occur, an inquiry or assessment as to whether convergence is likely 740 is made. When convergence is deemed unlikely regardless of the number of iterations the process ends 795. When convergence is deemed likely to occur if additional iterations were conducted, the encoded data stored in the FIFO 460 is communicated 745 to the auxiliary decoder module 440.

The auxiliary decoder module 745 again applies 750 a timing recovery process to ensure symbol synchronization. During this auxiliary timing recovery process 750 an inquiry is made whether a cycle slip index 560 is present or associated with this particular block of encoded data. When the answer to that inquiry is in the affirmative, the cycle slip is corrected 758 by the insertion or deletion of one more bits of data. Once the cycle slip issue has been resolved the data returns to the timing recovery process 750 and is thereafter communicated to the auxiliary LDPC error correction code decoder 490.

The auxiliary LDPC error correction code decoder 490 conducts 760 a second number of iterations to decode the encoded data, the second number of iterations being greater than the first number of iterations performed by the main LDPC error correction code decoder 470. Again, the question of convergence is asked 770. When the data fails to converge, a null block of data is saved 775 in the block matrix memory 425 and the process ends 795. When the data does converge, the null block of data previously stored in the block matrix memory 425 associated with this block of memory is identified 780. The newly decoded block of data replaces 790 the null block previously stored in the block memory matrix 425 ending 795 the process.

As will be understood by those familiar with the art, the invention may be embodied in other specific forms without departing from the spirit or essential characteristics thereof. Likewise, the particular naming and division of the modules, managers, functions, systems, engines, layers, features, attributes, methodologies and other aspects are not mandatory or significant, and the mechanisms that implement the invention or its features may have different names, divisions and/or formats. Furthermore, as will be apparent to one of ordinary skill in the relevant art, the modules, managers, functions, systems, engines, layers, features, attributes, methodologies and other aspects of the invention can be implemented as software, hardware, firmware or any combination of the three. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

We claim:

1. An iterative error correcting decoding system interposed between a network interface and a block matrix memory, the system comprising:

a First-In-First-Out ("FIFO") memory block for storing said data coupled to said network interface for receiving data;

at least one timing recovery module communicatively coupled to said network interface for receiving data, wherein each timing recovery module detects cycle slip;

an auxiliary timing recovery module communicatively coupled to each FIFO memory block;

a unique iterative error correction code decoder communicatively coupled to and interposed between each of said at least one timing recovery module and said block matrix memory wherein said unique iterative error correction code decoder performs a first number of error correcting iterations to achieve convergence and wherein, responsive to either said at least one timing recovery module detecting cycle slip or said unique iterative error correction code decoder failing to achieve convergence in said first number of iterations, communicating data in said FIFO memory block to said auxiliary timing recovery module; and an auxiliary iterative error correction code decoder communicatively coupled to and interposed between said auxiliary timing recovery module and said block matrix memory, wherein said auxiliary iterative error correction code decoder is configured to receive data from said auxiliary timing recovery module and perform a second number of error correcting iterations, said second number being greater than said first number.

2. The system of claim 1 wherein said data communicated from said FIFO memory block to said auxiliary timing recovery module includes state information of the unique iterative error correction code decoder from said first number of iterations.

3. The system of claim 1 wherein each block of data includes block identity information.

4. The system of claim 1 wherein subsequent to said first number of error correcting iterations being performed, said block matrix memory buffers data.

5. The system of claim 4 wherein, responsive to said auxiliary iterative error correction code decoder achieving convergence, replacing data buffered in said block matrix memory with converged data from said auxiliary iterative error correction code decoder.

6. The system of claim 1 wherein said first number of iterations and said second number of iterations is determined based on a group of factors consisting of statistical error analysis, system requirements of block error rate, and hardware resource availability.

7. The system of claim 1 wherein said unique iterative error correction code decoder is a LDPC error correction code decoder.

8. The system of claim 1 wherein responsive to the at least one timing recovery module detecting cycle slip, modifying data communicated to said auxiliary timing recovery module to eliminate cycle slip prior to performing said second number of error correcting iterations by said auxiliary iterative error correction code decoder.

9. The system of claim 1, wherein said auxiliary iterative error correction code decoder is a LDPC error correction code decoder.

10. An iterative decoding method comprising the steps of:
receiving a block of noise corrupted encoded data;
storing the encoded data in a FIFO block of memory;
examining at at least one timing recovery module the block of encoded data for cycle slip;
decoding iteratively the block of encoded data at an iterative error correction code decoder for a first number of error correcting iterations;
responsive to the iterative error correction code decoder failing to achieve convergence in said first number of error correcting iterations, communicating the stored encoded data from the FIFO block memory to an auxiliary iterative error correction code decoder; and
decoding iteratively the stored encoded data at the auxiliary iterative error correction code decoder for a second number of error correcting iterations.

11. The method of claim 10 wherein each block of encoded data includes block identity information.

12. The method of claim 10 further comprising subsequent to said first number of error correcting iterations being preformed, buffering data resulting from said iterations in a block matrix memory.

13. The method of claim 12 further comprising responsive to said auxiliary iterative error correction code decoder achieving convergence, replacing data buffered in said block matrix memory with converged data from said auxiliary iterative error correction code decoder.

14. The method of claim 10 wherein said first number of error correcting iterations and said second number of error correcting iterations is determined based on a group of factors consisting of statistical error analysis, system requirements of block error rate, and hardware resource availability.

15. The method of claim 10, wherein communicating includes applying an auxiliary timing recovery scheme to the block of encoded data prior to the block of encoded data's arrival at said auxiliary iterative error correction code decoder.

16. The method of claim 10 wherein responsive to the at least one timing recovery module detecting cycle slip, modifying said block of encoded data to eliminate cycle slip prior to performing said second number of error correcting iterations by said auxiliary iterative error correction code decoder.

17. An iterative decoding system, the system comprising:
a network interlace;
a primary iterative error correction code decoder communicatively coupled to the network interface for receiving encoded data;
a timing recovery module interposed between the network interface and the primary iterative error correction code decoder, wherein the timing recovery module detects cycle slip;
a FIFO memo block configured to store encoded data;
an auxiliary iterative error correction code decoder communicatively coupled to said primary iterative error correction code decoder, wherein responsive to the primary iterative error correction code decoder failing to achieve convergence over a first number of iterations, the auxiliary iterative error correction code decoder applies a second number of iterations to said encoded data, said second number of iterations being greater than said first number; and
a block matrix memory communicatively coupled to both the primary iterative error correction code decoder and the auxiliary iterative error correction code decoder, wherein unconverted encoded data from said primary iterative error correction code decoder is replaced by converged data from said auxiliary iterative error correction code decoder.

18. The system of claim 17, wherein responsive to cycle slip detection, encoded data is modified to eliminate cycle slip prior to applying said second number of iterations by said auxiliary iterative error correction code decoder.

19. The system of claim 17 wherein said first number of iterations and said second number of iterations is determined based on a group of factors consisting of statistical error analysis, system requirements of block error rate, and hardware resource availability.

20. The system of claim 17, further comprising an auxiliary timing recovery module communicatively coupled to the FIFO memory block.

* * * * *